United States Patent
Kim et al.

(10) Patent No.: US 10,423,187 B2
(45) Date of Patent: Sep. 24, 2019

(54) CURRENT CONTROL CIRCUIT AND BIAS GENERATOR INCLUDING THE SAME

(71) Applicant: SAMSUNG ELECTRONICS CO., LTD., Suwon-si (KR)

(72) Inventors: Sung Ho Kim, Yongin-si (KR); Junseok Kim, Hwaseong-si (KR); Yunjae Suh, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 120 days.

(21) Appl. No.: 15/675,109

(22) Filed: Aug. 11, 2017

(65) Prior Publication Data

US 2018/0059706 A1   Mar. 1, 2018

(30) Foreign Application Priority Data

Aug. 30, 2016  (KR) .................. 10-2016-0110867

(51) Int. Cl.
*G05F 3/24*  (2006.01)
*G05F 3/20*  (2006.01)
(Continued)

(52) U.S. Cl.
CPC ........... *G05F 3/205* (2013.01); *G05F 1/462* (2013.01); *G05F 3/242* (2013.01); *G05F 3/26* (2013.01); *H03K 5/133* (2013.01)

(58) Field of Classification Search
CPC .......... G05F 1/462; G05F 3/205; G05F 3/242; G05F 3/26
See application file for complete search history.

(56) References Cited

U.S. PATENT DOCUMENTS 5,949,274 A   9/1999   Stanchak
6,850,115 B2  2/2005   Gurvich et al.
(Continued)

FOREIGN PATENT DOCUMENTS

JP   4303731 B2   7/2009
JP   4777747 B2   9/2011
(Continued)

OTHER PUBLICATIONS

Tobi Delbruck et al; "32-bit Configurable Bias Current Generator with Sub-Off-Current Capability"; 2010 IEEE; pp. 1647-1650; 4 pgs. total.
(Continued)

*Primary Examiner* — Patrick O Neill
(74) *Attorney, Agent, or Firm* — Sughrue Mion, PLLC

(57) ABSTRACT

A current control circuit and a bias generator including the current control circuit are provided. The bias generator may include a current mirror circuit configured to generate one of a first current and a second current based on a reference current; a switch circuit configured to transfer one of the first current and the second current to a variable resistor; an operational amplifier including a first input node connected to the switch circuit, a second input node that receives a reference voltage, and an output node that outputs a bias voltage; and the variable resistor connected between the first input node and the output node of the operational amplifier. By switching operation of the switch circuit, a direction in which the first current flows in the variable resistor may be different from a direction in which the second current flows in the variable resistor.

16 Claims, 9 Drawing Sheets

(51) Int. Cl.
*G05F 3/26* (2006.01)
*G05F 1/46* (2006.01)
*H03K 5/133* (2014.01)

(56) References Cited

U.S. PATENT DOCUMENTS

| | | |
|---|---|---|
| 7,148,670 B2 | 12/2006 | Inn et al. |
| 7,560,978 B2 | 7/2009 | Byeon et al. |
| 7,656,144 B2 | 2/2010 | Cicalini |
| 7,728,269 B2 | 6/2010 | Lichtsteiner et al. |
| 7,788,509 B2 | 8/2010 | Sutardja |
| 8,125,256 B2 | 2/2012 | Vlasenko |
| 8,558,590 B2 * | 10/2013 | Shibayama ............... G05F 3/30 327/148 |
| 9,130,509 B2 | 9/2015 | Xu et al. |
| 9,356,594 B2 * | 5/2016 | Cho .................... H03K 17/163 |
| 9,680,483 B2 * | 6/2017 | Tsunoda ............... H03L 7/0895 |
| 2004/0036532 A1 | 2/2004 | Gurvich et al. |
| 2006/0114019 A1 | 6/2006 | Sutardja |
| 2006/0158165 A1 | 7/2006 | Inn et al. |
| 2007/0236202 A1 | 10/2007 | Cicalini |
| 2007/0279123 A1 | 12/2007 | Byeon et al. |
| 2008/0135731 A1 | 6/2008 | Lichtsteiner et al. |
| 2011/0234308 A1 | 9/2011 | Vlasenko |
| 2014/0097905 A1 | 4/2014 | Xu et al. |

FOREIGN PATENT DOCUMENTS

| | | |
|---|---|---|
| JP | 5242729 B2 | 7/2013 |
| JP | 5308407 B2 | 10/2013 |
| KR | 10-0825956 B1 | 4/2008 |
| KR | 10-0857876 B1 | 9/2008 |
| WO | 99/15943 A1 | 4/1999 |
| WO | 00/46649 A1 | 8/2000 |
| WO | 2004019484 A2 | 3/2004 |
| WO | 2007/118171 A1 | 10/2007 |
| WO | 2008/151435 A1 | 12/2008 |

OTHER PUBLICATIONS

Minhao Yang et al; "Addressable Current Reference Array with 170dB Dynamic Range"; 2012 IEEE; pp. 3110-3113; 4 pgs. total.

* cited by examiner

800

US 10,423,187 B2

CURRENT CONTROL CIRCUIT AND BIAS GENERATOR INCLUDING THE SAME

CROSS-REFERENCE TO RELATED APPLICATION

This application claims priority from Korean Patent Application No. 10-2016-0110867, filed on Aug. 30, 2016, in the Korean Intellectual Property Office, the disclosure of which is incorporated herein by reference in its entirety.

BACKGROUND

1. Field

Methods and apparatuses consistent with exemplary embodiments relate to a current control circuit and a bias generator including the current control circuit.

2. Description of the Related Art

A constant bias voltage or current may be used to operate a terminal, such as a smartphone or a mobile device, or to drive a sensor included in the terminal. Because the bias voltage or current is used as an operation reference point of the terminal or the sensor, the bias voltage or current may need to be precisely controlled for an operation with high accuracy. When a linear characteristic of the bias voltage or current is not guaranteed for a wide range, it may be difficult to precisely control the bias voltage or current. Also, when an operating time of the terminal or the sensor is considered, power consumed to generate a relatively high bias voltage or current may also need to be considered.

SUMMARY

Various exemplary embodiments may address at least the above problems and/or disadvantages and other disadvantages not described above. Also, the exemplary embodiments are not required to overcome the disadvantages described above, and an exemplary embodiment may not overcome any of the problems described above.

According to an aspect of an exemplary embodiment, there is provided a bias generator including: a current mirror circuit configured to generate a first current and a second current based on a reference current; a switch circuit configured to transfer one of the first current and the second current to a variable resistor; and an operational amplifier including a first input connected to an output of the switch circuit, a second input that receives a reference voltage, and an output that outputs a bias voltage. The variable resistor connected between the first input and the output. By switching operation of the switch circuit, a direction in which the first current flows in the variable resistor may be different from a direction in which the second current flows in the variable resistor.

The bias voltage may be determined based on the reference voltage, and a voltage drop/rise that occurs in the variable resistor.

The bias voltage may be determined based on the reference voltage, the variable resistor, and one of the first current and the second current flowing in the variable resistor.

The bias voltage may have a linear characteristic for a resistance value of the variable resistor with respect to the reference voltage.

The current mirror circuit may include a first current mirror including a first transistor and a second transistor. A gate of the first transistor and a gate of the second transistor may be connected to each other. The reference current may flow through the first transistor, and the first current may be generated in the second transistor and transferred to the switch circuit.

Each of the first transistor and the second transistor may include a plurality of P-type transistors.

The current mirror circuit may further include a second current mirror including the first transistor, a third transistor, a fourth transistor, and a fifth transistor. The gate of the first transistor and a gate of the third transistor may be connected to each other, and a gate of the fourth transistor and a gate of the fifth transistor may be connected to each other. The reference current may flow through the first transistor, and a third current may be output from the third transistor based on the reference current and may flow through the fourth transistor. The second current may be generated in the fifth transistor and may be transferred to the switch circuit.

Each of the first transistor and the third transistor may include a plurality of P-type transistors, and each of the fourth transistor and the fifth transistor may include a plurality of N-type transistors.

The current mirror circuit may further include a third current mirror including the first transistor, a sixth transistor and a seventh transistor. The gate of the first transistor and a gate of the sixth transistor may be connected to each other. The reference current may flow through the first transistor. A fourth current may be output from the sixth transistor based on the reference current and may flow through the seventh transistor. The reference voltage may be output from a gate of the seventh transistor and may be applied to the second input of the operational amplifier.

Each of the first transistor and the sixth transistor may include a plurality of P-type transistors, and the seventh transistor may include a plurality of N-type transistors.

The switch circuit may include a first switch and a second switch. The first switch may be configured to connect the current mirror circuit and the variable resistor to transfer the first current generated in the current mirror circuit to the variable resistor, and the second switch may be configured to connect the current mirror circuit and the variable resistor to transfer the second current generated in the current mirror circuit to the variable resistor.

The reference current may be generated by a reference current generator and may be transferred to the current mirror circuit. The reference current generator may include a reference operational amplifier including a third input to which a second reference voltage that is determined in advance is applied, a fourth input connected to a reference resistor, and a second output connected to a gate of a reference transistor, the reference resistor in which the reference current generated based on the second reference voltage flows, and the reference transistor in which the reference current flows, the reference transistor being connected between the reference resistor and the current mirror circuit.

The reference current may be generated in response to a second reference voltage that is determined in advance being applied to a reference variable resistor, and may be transferred to the current mirror circuit.

The reference voltage may be output from a digital-to-analog converter (DAC) based on a digital code input to the DAC, and may be applied to the second input of the operational amplifier.

According to an aspect of an exemplary embodiment, there is provided a current control circuit including a current mirror circuit that is configured to generate a first current and a second current based on a reference current, an output, and a switch circuit that is configured to output one of the first current and the second current to the output. A direction in which the first current is output to the output by the switch circuit may be different from a direction in which the second current is output to the output by the switch circuit.

DETAILED DESCRIPTION OF EXEMPLARY EMBODIMENTS

Below, exemplary embodiments of the present disclosure will be described more fully with reference to accompanying drawings to such an extent that one of an ordinary skill in the art may implement various aspects of the present disclosure.

Figure 1:
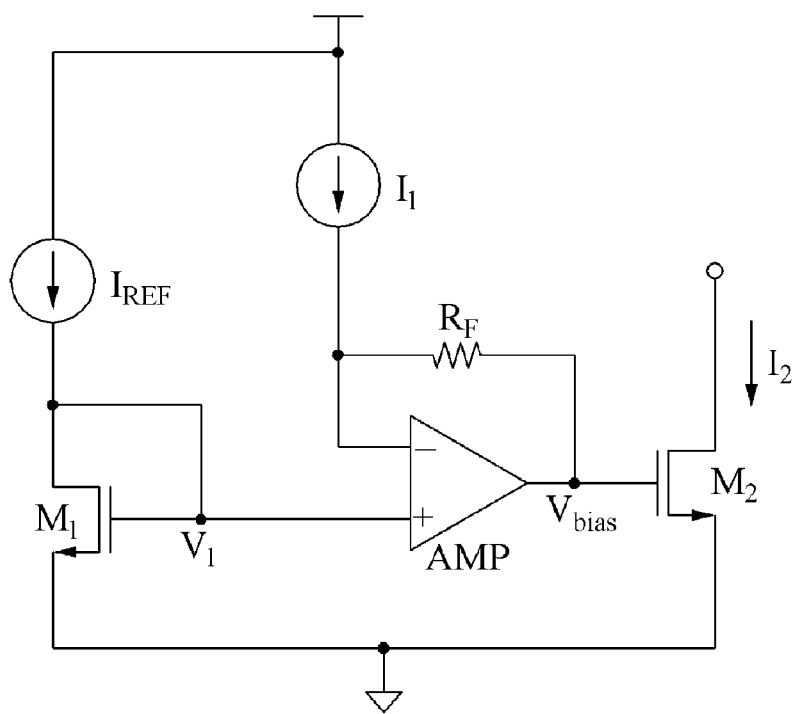
FIGS. 1 and 2 are diagrams illustrating an operation of a bias generator according to an exemplary embodiment.
Figure 2:
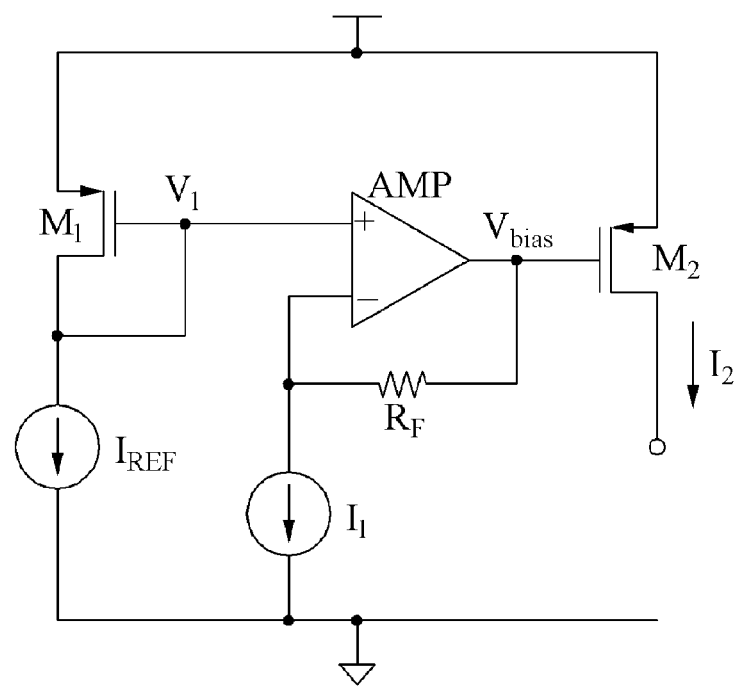

FIGS. 1 and 2 are diagrams illustrating an operation of a bias generator according to an exemplary embodiment.

A bias generator may generate at least one of a bias voltage or a bias current, and may be implemented as, for example, at least one circuit device. The bias generator may generate at least one of a bias voltage or a bias current required to operate a user terminal, for example, a smartphone, a mobile device or a wearable device, or to operate a sensor included in the user terminal. The sensor may include various sensors, such as a vision sensor, a global positioning system (GPS) sensor or a temperature sensor. The vision sensor may include, for example, a dynamic vision sensor (DVS).

For example, the bias generator may be included in the DVS and may generate at least one of a bias voltage or a bias current required to operate the DVS.

FIG. 1 illustrates a circuit 100 to describe a basic operation principle of a bias generator based on N-type transistors. The circuit 100 may generate a bias voltage $V_{bias}$ using an N-type transistor-based current mirror.

In the circuit 100 of FIG. 1, a reference current $I_{REF}$ may flow from a drain node of a first transistor $M_1$ to a source node of the first transistor $M_1$, and a first voltage $V_1$ may be applied to a gate node and the drain node of the first transistor $M_1$ because of the reference current $I_{REF}$. The first voltage $V_1$ applied to the gate node and the drain node of the first transistor $M_1$ may be determined by the reference current $I_{REF}$.

The first voltage $V_1$ may be transferred to a positive node of an operational amplifier (OP-AMP). For convenience of description, the operational amplifier is denoted by "AMP" as shown in FIG. 1. Because of a high input impedance of the operational amplifier, the positive node and a negative node of the operational amplifier may be virtually grounded. Thus, the first voltage $V_1$ may also be applied to the negative node.

A first current $I_1$ may flow to a resistor $R_F$ because of the high input impedance of the operational amplifier. A voltage drop may occur in the resistor $R_F$ because of the first current $I_1$, which may cause the bias voltage $V_{bias}$ to be less than the first voltage $V_1$. The bias voltage $V_{bias}$ may be represented as shown in Equation 1 below.

$$V_{bias} = V_1 - I_1 \times R_F \quad \text{[Equation 1]}$$

In the circuit 100 of FIG. 1, each of the first voltage $V_1$ and the first current $I_1$ may be fixed to a predetermined value. However, even though a value of each of the first voltage $V_1$ and the first current $I_1$ is fixed, the bias voltage $V_{bias}$ may be easily controlled by changing a resistance value of the resistor $R_F$. The bias voltage $V_{bias}$ may have a linear characteristic with regard to the resistance value of the resistor $R_F$ based on the first voltage $V_1$.

For example, when the first current $I_1$ flows in an opposite direction to that shown in FIG. 1, a voltage rise may occur in the resistor $R_F$. Because of the voltage rise, the bias voltage $V_{bias}$ may be greater than the first voltage $V_1$. In this example, the bias voltage $V_{bias}$ may be represented as shown in Equation 2 below.

$$V_{bias} = V_1 + I_1 \times R_F \quad \text{[Equation 2]}$$

Similarly, in Equation 2, even though a value of each of the first voltage $V_1$ and the first current $I_1$ is fixed, the bias voltage $V_{bias}$ may be easily controlled by changing the resistance value of the resistor $R_F$.

As described above, the bias voltage $V_{bias}$ may be determined based on the first voltage $V_1$, and the voltage drop or the voltage rise that occurs in the resistor $R_F$. Also, the bias voltage $V_{bias}$ may be determined based on the first voltage $V_1$, the first current $I_1$ and the resistor $R_F$.

Thus, it is possible to control the bias voltage $V_{bias}$ linearly with the resistor $R_F$ by changing the resistance value of the resistor $R_F$ without a change of the reference current $I_{REF}$.

In addition, the bias voltage $V_{bias}$ may be provided to a gate node of a second transistor $M_2$, and the second transistor $M_2$ may generate a second current $I_2$ based on the bias voltage $V_{bias}$.

FIG. 2 illustrates a circuit 200 to describe a basic operation principle of an exemplary bias generator based on P-type transistors. The circuit 200 may generate a bias voltage $V_{bias}$ using a P-type transistor-based current mirror.

In the circuit 200 of FIG. 2, a reference current $I_{REF}$ may flow from a source node of a first transistor $M_1$ to a drain node of the first transistor $M_1$, and a first voltage $V_1$ may be applied to a gate node and the drain node of the first transistor $M_1$ because of the reference current $I_{REF}$. Also, the first voltage $V_1$ may be transferred to a positive node of an operational amplifier ("AMP"), and the positive node and a negative node of the operational amplifier may be virtually grounded. Thus, the first voltage $V_1$ may also be applied to the negative node.

A first current $I_1$ may flow to a resistor $R_F$ because of a high input impedance of the operational amplifier, and accordingly a voltage rise may occur in the resistor $R_F$. Because of the voltage rise, the bias voltage $V_{bias}$ may be greater than the first voltage $V_1$.

For example, when the first current $I_1$ flows in an opposite direction to that shown in FIG. 2, a voltage drop may occur in the resistor $R_F$. Because of the voltage drop, the bias voltage $V_{bias}$ may be less than the first voltage $V_1$.

Because the circuit 200 is configured by changing a type of transistors in the circuit 100 of FIG. 1, the basic operation principle of FIG. 1 may be applicable to the circuit 200. Thus, in FIG. 2, the bias voltage $V_{bias}$ may be determined based on the first voltage $V_1$, and the voltage drop or the voltage rise that occurs in the resistor $R_F$. Also, the bias voltage $V_{bias}$ may be determined based on the first voltage $V_1$, the first current $I_1$ and the resistor $R_F$.

Figure 3:
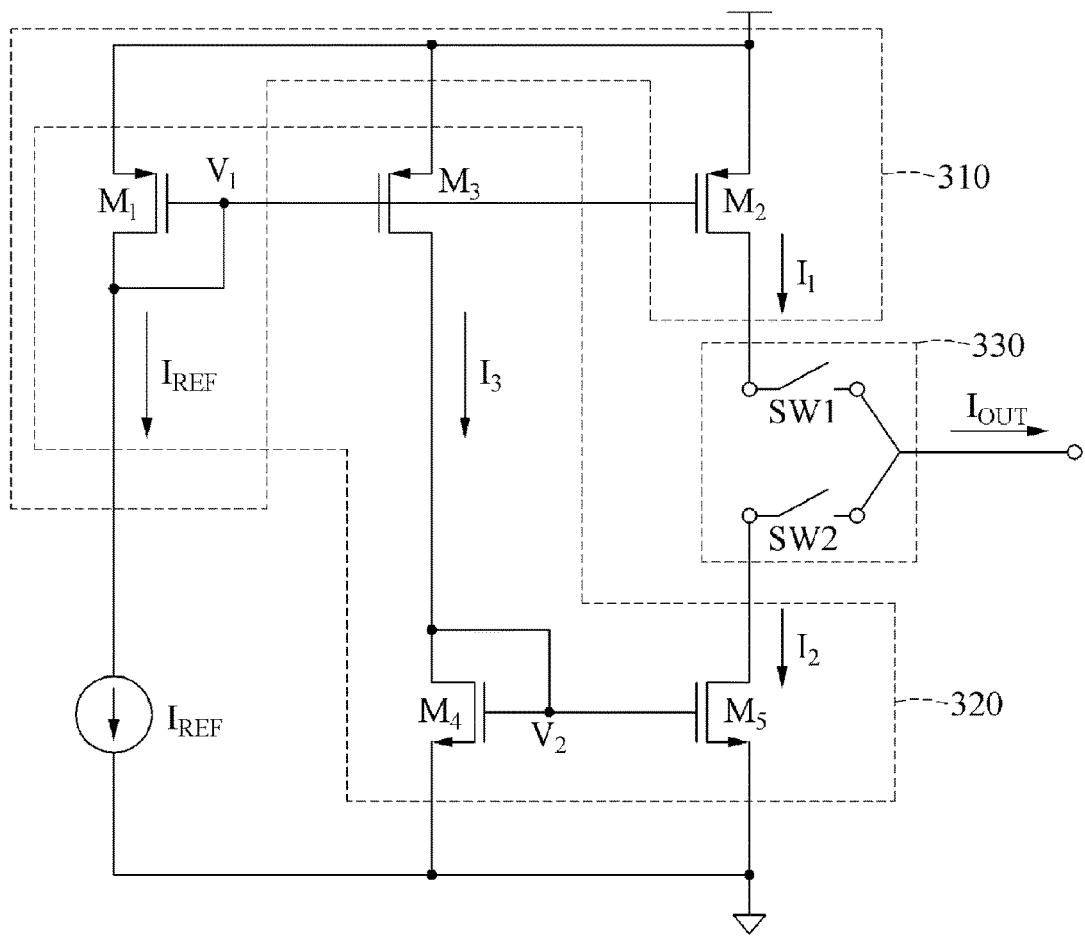
FIG. 3 is a diagram illustrating a current control circuit according to an exemplary embodiment.

FIG. 3 is a diagram illustrating a current control circuit 300 according to an exemplary embodiment.

The current control circuit 300 of FIG. 3 may be used in a bias generator. Prior to describing the bias generator, an operation of the current control circuit 300 is described with reference to FIG. 3.

As described above with reference to FIG. 1, a direction in which a current flows in a resistor $R_F$ may be controlled to allow a bias voltage $V_{bias}$ to be greater or less than a first voltage $V_1$. By controlling the direction in which the current flows in the resistor $R_F$, a control range of the bias voltage $V_{bias}$ may be further widened. To widen the control range of the bias voltage $V_{bias}$, the current control circuit 300 capable of controlling the direction in which the current flows in the resistor $R_F$ may be required.

Referring to FIG. 3, the current control circuit 300 may include a current mirror circuit and a switch circuit 330. The current mirror circuit may include a first current mirror 310 and a second current mirror 320.

The current mirror circuit may generate one of a first current $I_1$ and a second current $I_2$ based on a reference current $I_{REF}$. For example, the first current mirror 310 may generate the first current $I_1$ based on the reference current $I_{REF}$, and the second current mirror 320 may generate the second current $I_2$ based on the reference current $I_{REF}$. The first current mirror 310 and the second current mirror 320 may share a first transistor $M_1$.

The first current mirror 310 may include the first transistor $M_1$ and a second transistor $M_2$. The reference current $I_{REF}$ may flow from a source node of the first transistor $M_1$ to a drain node of the first transistor $M_1$, and the first voltage $V_1$ may be applied to a gate node and the drain node of the first transistor $M_1$ because of the reference current $I_{REF}$ flowing in the first transistor $M_1$. The gate node of the first transistor $M_1$ may be connected to a gate node of the second transistor $M_2$, and accordingly the first voltage $V_1$ may be applied to the gate node of the second transistor $M_2$. The second transistor $M_2$ may generate the first current $I_1$ based on the first voltage $V_1$ applied to the gate node, and the generated first current $I_1$ may flow from a source node of the second transistor $M_2$ to a drain node of the second transistor $M_2$.

The second current mirror 320 may include the first transistor $M_1$, a third transistor $M_3$, a fourth transistor $M_4$, and a fifth transistor $M_5$. The reference current $I_{REF}$ may flow from the source node of the first transistor $M_1$ to the drain node of the first transistor $M_1$, and the first voltage $V_1$ may be applied to the gate node and the drain node of the first transistor $M_1$ because of the reference current $I_{REF}$ flowing in the first transistor $M_1$. The gate node of the first transistor $M_1$ may be connected to a gate node of the third transistor $M_3$, and accordingly the first voltage $V_1$ may be applied to the gate node of the third transistor $M_3$. The third transistor $M_3$ may generate a third current $I_3$ based on the first voltage $V_1$ applied to the gate node, and the generated third current $I_3$ may flow from the third transistor $M_3$ to the fourth transistor $M_4$.

Because of the third current $I_3$ flowing in the fourth transistor $M_4$, a second voltage $V_2$ may be applied to a gate node and a drain node of the fourth transistor $M_4$. The gate node of the fourth transistor $M_4$ may be connected to a gate node of the fifth transistor $M_5$, and accordingly the second voltage $V_2$ may be applied to the gate node of the fifth transistor $M_5$. The fifth transistor $M_5$ may generate the second current $I_2$ based on the second voltage $V_2$ applied to the gate node, and the generated second current $I_2$ may flow from a drain node of the fifth transistor $M_5$ to a source node of the fifth transistor $M_5$.

The first transistor $M_1$, the second transistor $M_2$, and the third transistor $M_3$ may be P-type transistors, and the fourth transistor $M_4$ and the fifth transistor $M_5$ may be N-type transistors.

The switch circuit 330 may output one of the first current $I_1$ and the second current $I_2$ generated in the current mirror circuit to an output node of the current control circuit 300. The switch circuit 330 may include two switches, for example, a first switch $SW_1$ and a second switch $SW_2$.

The first switch $SW_1$ may connect the current mirror circuit and the output node of the current control circuit 300 so that the first current $I_1$ generated in the current mirror circuit may be output to the output node of the current control circuit 300. The second switch $SW_2$ may connect the current mirror circuit and the output node so that the second current $I_2$ generated in the current mirror circuit may be output to the output node of the current control circuit 300.

To output one of the first current $I_1$ and the second current $I_2$ generated in the current mirror circuit to the output node, the first switch $SW_1$ and the second switch $SW_2$ may be selectively turned on. In an example, when the first switch $SW_1$ is turned on and the second switch $SW_2$ is turned off, the first current $I_1$ may be output to the output node. In another example, when the first switch $SW_1$ is turned off and the second switch $SW_2$ is turned on, the second current $I_2$ may be output to the output node. The operation as described above may be switching operation.

By switching operation of the switch circuit 330, a direction in which the first current $I_1$ is output to the output node by the switch circuit 330 may be different from a direction in which the second current $I_2$ is output to the output node by the switch circuit 330. For example, the direction in which the first current $I_1$ is output to the output node may be the same as the direction indicated by an arrow $I_{out}$ of FIG. 3. Also, the direction in which the second current $I_2$ is output to the output node may be opposite to the direction indicated by the arrow $I_{out}$ of FIG. 3.

As described above, it is possible to effectively control a direction in which a current is output using the switch circuit 330 and the current mirror circuit that includes the first current mirror 310 and the second current mirror 320.

A magnitude of the first current $I_1$ may be determined based on a magnitude of the reference current $I_{REF}$ and a physical design (e.g., a width/length (w/l) ratio) of transistors included in the first current mirror 310. Similarly, a magnitude of the second current $I_2$ may be determined based on the magnitude of the reference current $I_{REF}$ and a physical design of transistors included in the second current mirror 320. Thus, the magnitude of the first current $I_1$ and the magnitude of the second current $I_2$ may be the same or different from each other, based on the respective physical designs.

Hereinafter, for convenience of description, an example in which a first current $I_1$ and a second current $I_2$ have the same magnitude but flow in different directions is described. However, this is not provided as a limitation but by way of an example only, and an example in which the first current $I_1$ and a second current $I_2$ have different magnitudes is not excluded.

Figure 4:
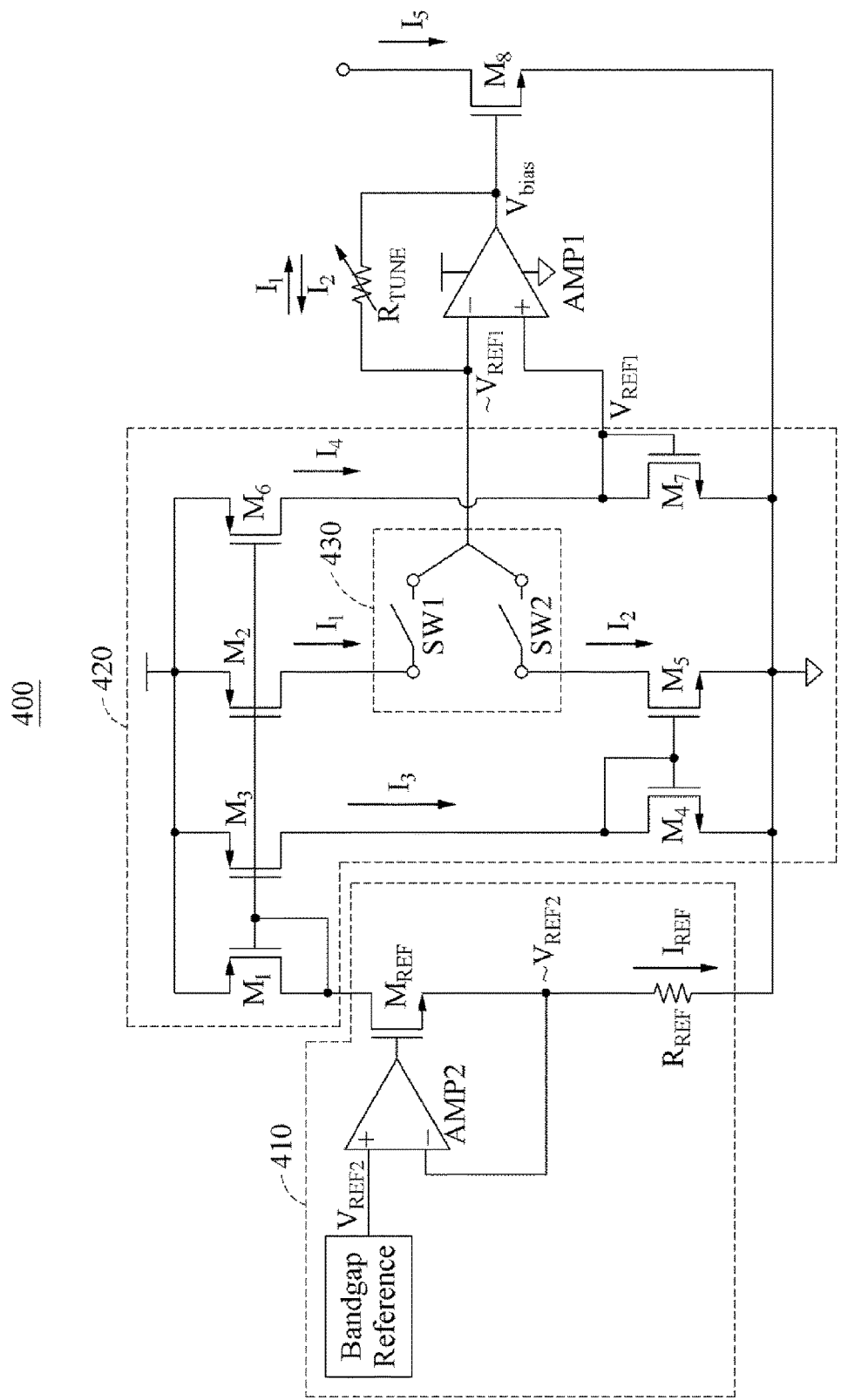
FIG. 4 is a diagram illustrating an example of a bias generator according to an exemplary embodiment.

FIG. 4 is a diagram illustrating a bias generator 400 according to an exemplary embodiment.

As shown in FIG. 4, the bias generator 400 may include a current mirror circuit 420, a switch circuit 430, a variable resistor $R_{TUNE}$, and a first operational amplifier $AMP_1$. The bias generator 400 may further include a reference current generator 410.

The current mirror circuit 420 may generate one of a first current $I_1$ and a second current $I_2$ based on a reference current $I_{REF}$. For example, the reference current $I_{REF}$ may be generated in the reference current generator 410 and may be provided to the current mirror circuit 420. Prior to describing an operation of generating the reference current $I_{REF}$ in the reference current generator 410, an operation of generating a bias voltage $V_{bias}$ will be described.

The current mirror circuit 420 may include a first current mirror that generates the first current $I_1$ based on the reference current $I_{REF}$, and a second current mirror that generates the second current $I_2$ based on the reference current $I_{REF}$.

The first current mirror may include a first transistor $M_1$ and a second transistor $M_2$. A gate node of the first transistor $M_1$ and a gate node of the second transistor $M_2$ may be connected to each other. The first current mirror may generate the first current $I_1$ flowing in the second transistor $M_2$ based on the reference current $I_{REF}$ flowing in the first transistor $M_1$.

The second current mirror may include the first transistor $M_1$, a third transistor $M_3$, a fourth transistor $M_4$ and a fifth transistor $M_5$. The gate node of the first transistor $M_1$ and a gate node of the third transistor $M_3$ may be connected to each other, and a gate node of the fourth transistor $M_4$ and a gate node of the fifth transistor $M_5$ may be connected to each other. A drain node of the third transistor $M_3$ may be connected to a drain node of the fourth transistor $M_4$, and accordingly a third current $I_3$ generated in the third transistor $M_3$ may flow to the fourth transistor $M_4$. The reference current $I_{REF}$ may flow through the first transistor $M_1$, and accordingly the third current $I_3$ may be generated based on the reference current $I_{REF}$ in the third transistor $M_3$. Also, the third current $I_3$ may flow to the fourth transistor $M_4$ connected to the third transistor $M_3$, and the second current $I_2$ may be generated in the fifth transistor $M_5$ based on the third current $I_3$. The first transistor $M_1$, the second transistor $M_2$, and the third transistor $M_3$ may be P-type transistors, and the fourth transistor $M_4$ and the fifth transistor $M_5$ may be N-type transistors.

One of the first current $I_1$ and the second current $I_2$ generated in the current mirror circuit 420 may be transferred to the variable resistor $R_{TUNE}$ through the switch circuit 430. The switch circuit 430 may include a first switch $SW_1$ and a second switch $SW_2$.

The first switch $SW_1$ may connect the current mirror circuit 420 and the variable resistor $R_{TUNE}$ so that the first current $I_1$ generated in the current mirror circuit 420 may be transferred to the variable resistor $R_{TUNE}$. The second switch $SW_2$ may connect the current mirror circuit 420 and the variable resistor $R_{TUNE}$ so that the second current $I_2$ generated in the current mirror circuit 420 may be transferred to the variable resistor $R_{TUNE}$. The first switch $SW_1$ and the second switch $SW_2$ may be selectively turned on.

The above description of FIG. 3 is also applicable to the first current mirror, the second current mirror, and the switch circuit 430 of FIG. 4, and accordingly is not repeated here.

The first operational amplifier $AMP_1$ may include a first input node connected to the switch circuit 430, a second input node that receives a reference voltage from the current mirror circuit 420, and an output node that outputs the bias voltage $V_{bias}$. The first input node and the second input node may refer to a negative node and a positive node of the first operational amplifier $AMP_1$, respectively. The first input node and the second input node may be virtually grounded because of a high impedance of the first operational amplifier $AMP_1$, and the same voltage may be applied to the first input node and the second input node.

The second input node of the first operational amplifier $AMP_1$ may receive a first reference voltage $V_{REF1}$ from the current mirror circuit 420. The current mirror circuit 420 may further include a third current mirror configured to generate a reference voltage applied to the second input node of the first operational amplifier $AMP_1$.

The third current mirror may include the first transistor $M_1$, a sixth transistor $M_6$ and a seventh transistor $M_7$. The gate node of the first transistor $M_1$ and a gate node of the sixth transistor $M_6$ may be connected to each other, and a drain node of the sixth transistor $M_6$ and a drain node of the seventh transistor $M_7$ may be connected to each other. A fourth current $I_4$ may be generated in the sixth transistor $M_6$ based on the reference current $I_{REF}$ flowing in the first transistor $M_1$ and may flow through the seventh transistor $M_7$. The first reference voltage $V_{REF1}$ may be generated in a gate node of the seventh transistor $M_7$ because of the fourth current $I_4$ flowing in the seventh transistor $M_7$. The first reference voltage $V_{REF1}$ may be applied to the second input node of the first operational amplifier $AMP_1$. The sixth transistor $M_6$ may be a P-type transistor, and the seventh transistor $M_7$ may be an N-type transistor.

When the first reference voltage $V_{REF1}$ is applied to the second input node of the first operational amplifier $AMP_1$, the first reference voltage $V_{REF1}$ may be applied to a first input node of the first operational amplifier $AMP_1$. A voltage of the first input node may be fixed to the first reference voltage $V_{REF1}$ of the second input node.

The first input node of the first operational amplifier $AMP_1$ may be connected to the switch circuit 430, and accordingly one of the first current $I_1$ and the second current $I_2$ generated in the current mirror circuit 420 may be transferred to the first input node of the first operational amplifier $AMP_1$. However, because of a high input impedance of the first operational amplifier $AMP_1$, one of the first current $I_1$ and the second current $I_2$ transferred from the current mirror circuit 420 may flow to the variable resistor $R_{TUNE}$.

A direction in which the first current $I_1$ flows in the variable resistor $R_{TUNE}$ through the switch circuit 430 may be different from a direction in which the second current $I_2$ flows in the variable resistor $R_{TUNE}$ through the switch circuit 430. For example, when the first switch $SW_1$ of the switch circuit 430 is turned on, the first current $I_1$ may flow from a left end of the variable resistor $R_{TUNE}$ (i.e., the end that is connected to the first input node of the first operational amplifier $AMP_1$) to a right end of the variable resistor $R_{TUNE}$ (i.e., the end that is connected to the output node of the first operational amplifier $AMP_1$). When the second switch $SW_2$ of the switch circuit 430 is turned on, the second current $I_2$ may flow from the right end to the left end of the variable resistor $R_{TUNE}$.

Based on the above-described directions, a voltage drop or a voltage rise may occur in the variable resistor $R_{TUNE}$. In an example, when the first current $I_1$ flows in the variable resistor $R_{TUNE}$, a voltage drop may occur in the variable resistor $R_{TUNE}$. In another example, when the second current $I_2$ flows in the variable resistor $R_{TUNE}$, a voltage rise may occur in the variable resistor $R_{TUNE}$. Thus, the bias voltage $V_{bias}$ output from the output node of the first operational amplifier $AMP_1$ may be determined based on the first reference voltage $V_{REF1}$, and the voltage drop or voltage rise that occurs in the variable resistor $R_{TUNE}$.

Because the first reference voltage $V_{REF1}$ is fixed as a voltage applied to the second input node of the first operational amplifier $AMP_1$, the bias voltage $V_{bias}$ may be less than the first reference voltage $V_{REF1}$ in response to the voltage drop occurring in the variable resistor $R_{TUNE}$, and the bias voltage $V_{bias}$ may be greater than the first reference voltage $V_{REF1}$ in response to the voltage rise occurring in the variable resistor $R_{TUNE}$. The first current $I_1$ causing the voltage drop in the variable resistor $R_{TUNE}$ may be a p-type current for low-voltage generation, and the second current $I_2$ causing the voltage rise in the variable resistor $R_{TUNE}$ may be an n-type current for high-voltage generation. The p-type current may refer to a current generated in a P-type transistor and the n-type current may refer to a current generated in an N-type transistor.

The variable resistor $R_{TUNE}$ may be connected between the first input node and the output node of the first operational amplifier $AMP_1$. The variable resistor $R_{TUNE}$ may have a variable resistance value, for example, a resistance value controlled using a digital scheme. For example, the variable resistor $R_{TUNE}$ may have a resistance value corresponding to a multiple of a basic resistance unit based on a digital code. In an example, when the basic resistance unit is set to 2 kilo-ohms (kΩ) and a digital code is "000001," the variable resistor $R_{TUNE}$ may have a resistance value of "2k×1Ω" In this example, when the digital code is "000010," the variable resistor $R_{TUNE}$ may have a resistance value of "2k×2Ω" An internal structure of the variable resistor $R_{TUNE}$ will be described with reference to FIG. 8.

The bias voltage $V_{bias}$ may be represented as shown in Equation 3 below.

$$V_{bias} = \begin{cases} V_{REF1} - D_i\Delta, & \text{if } SW_1 \text{ is on}, SW_2 \text{ is off} \\ V_{REF1} + D_i\Delta, & \text{if } SW_1 \text{ is off}, SW_2 \text{ is on} \end{cases} \quad \text{[Equation 3]}$$

$$\Delta = \begin{cases} |I_1| \cdot R_{TUNE,unit}, & \text{if } SW_1 \text{ is on}, SW_2 \text{ is off} \\ |I_2| \cdot R_{TUNE,unit}, & \text{if } SW_1 \text{ is off}, SW_2 \text{ is on} \end{cases}$$

In Equation 3, $R_{TUNE,unit}$ denotes a basic resistance unit, and $D_i$ denotes a value obtained by converting a digital code to a decimal number. For example, when a digital code has 6 bits, the variable resistor $R_{TUNE}$ may have 63 resistance values. In this example, a minimum resistance value may be 0Ω, and a maximum resistance value may be 126 kΩ when the basic resistance unit $R_{TUNE,unit}$ is 2 kΩ.

As described above, the bias voltage $V_{bias}$ may be determined based on the first reference voltage $V_{REF1}$, one of the first current $I_1$ and the second current $I_2$ flowing in the variable resistor $R_{TUNE}$, and the variable resistor $R_{TUNE}$. Because the first reference voltage $V_{REF1}$ is fixed as a voltage applied to the second input node of the first operational amplifier $AMP_1$, the bias voltage $V_{bias}$ may have a linear characteristic with regard to the resistance value of the variable resistor $R_{TUNE}$ based on the first reference voltage $V_{REF1}$.

The bias voltage $V_{bias}$ may be applied to a gate node of an eighth transistor $M_8$, and the eighth transistor $M_8$ may generate a fifth current $I_5$ based on the bias voltage $V_{bias}$.

The reference current $I_{REF}$ used in the current mirror circuit 420 may be generated by the reference current generator 410. The reference current generator 410 may include a bandgap reference, the second operational amplifier $AMP_2$, a reference resistor $R_{REF}$, and a reference transistor $M_{REF}$.

The bandgap reference may be a circuit that generates a stable voltage irrespective of process, voltage, and temperature (PVT) variations. For example, the bandgap reference may generate a second reference voltage $V_{REF2}$ that is determined in advance. The second reference voltage $V_{REF2}$ generated in the bandgap reference may be applied to a third input node that is a positive node of the second operational amplifier $AMP_2$.

A fourth input node that is a negative node of the second operational amplifier $AMP_2$ may be connected to the reference resistor $R_{REF}$. Because of a virtual ground of the second operational amplifier $AMP_2$, the second reference voltage $V_{REF2}$ may be applied to the fourth input node and may also be applied to the reference resistor $R_{REF}$.

The reference current $I_{REF}$ based on the second reference voltage $V_{REF2}$ may flow in the reference resistor $R_{REF}$. Because of a high input impedance of the second operational amplifier $AMP_2$, the reference current $I_{REF}$ may flow through the reference transistor $M_{REF}$, and may be provided to the current mirror circuit 420.

Figure 5:
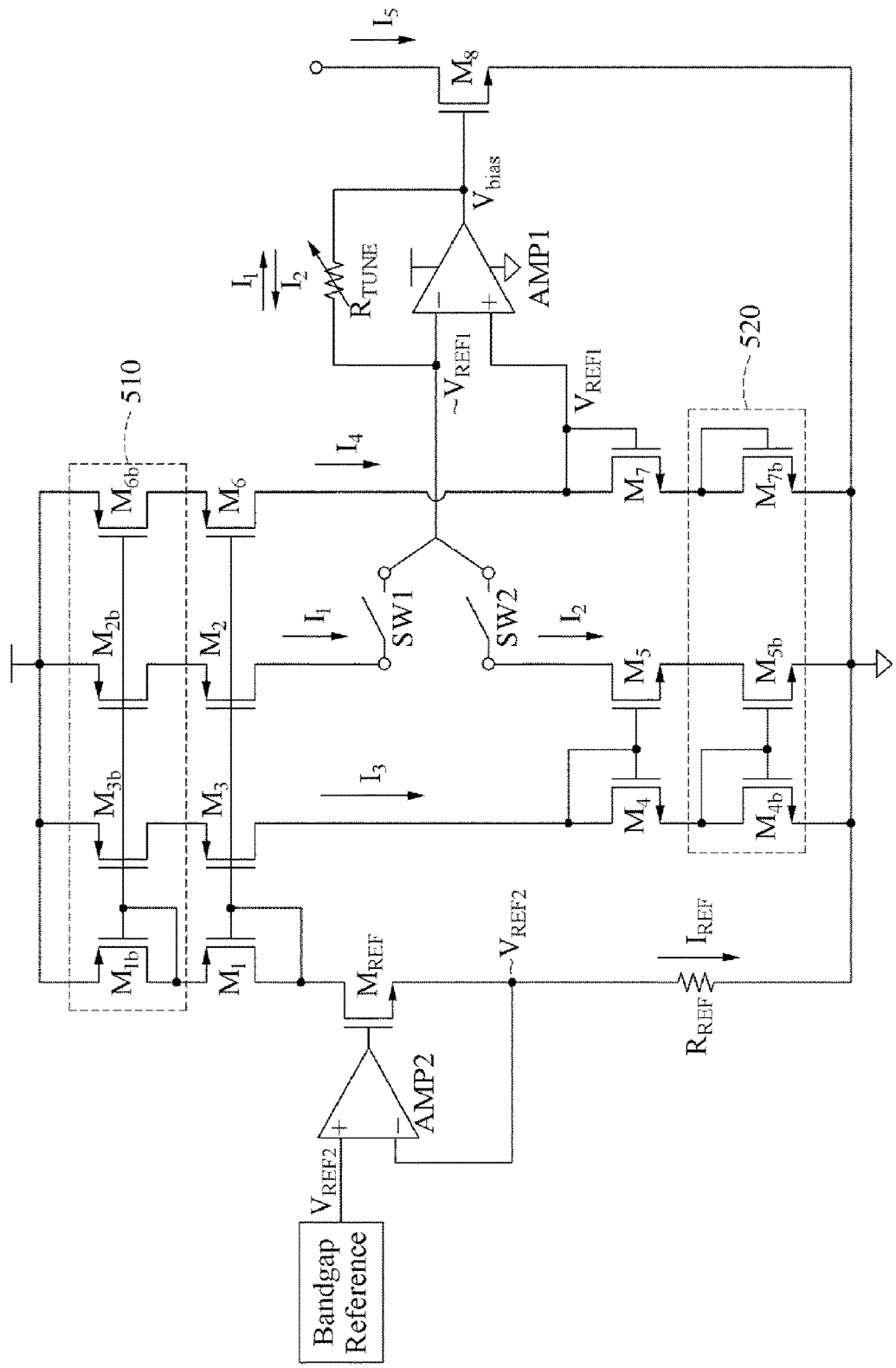
FIGS. 5, 6, and 7 are diagram illustrating examples of a bias generator according to an exemplary embodiment.
Figure 6:
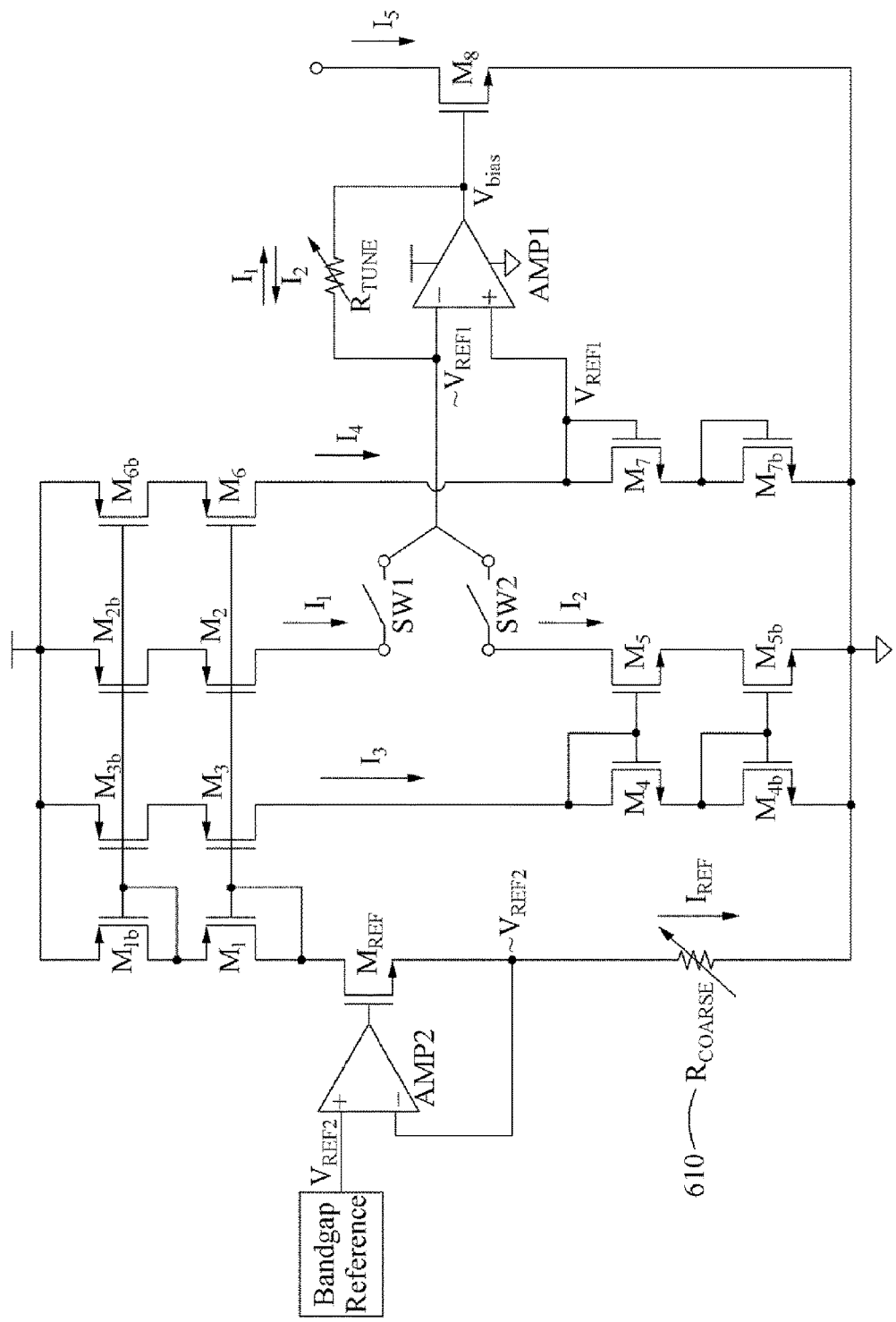
Figure 7:
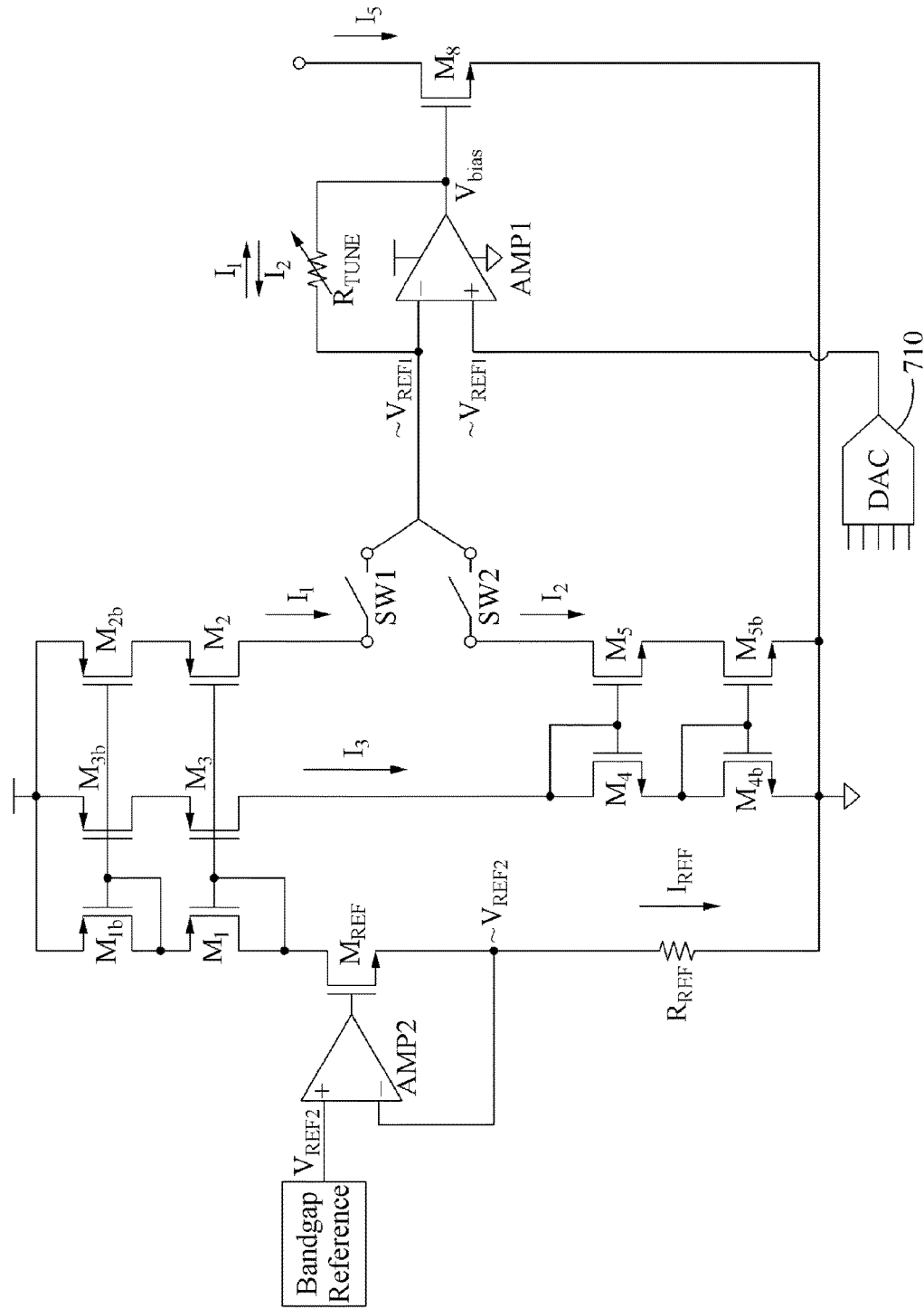

FIGS. 5, 6 and 7 are diagrams illustrating examples of a bias generator according to an exemplary embodiment.

FIG. 5 illustrates an exemplary bias generator configured by adding transistors to the bias generator 400 of FIG. 4.

As shown in FIG. 5, P-type transistors 510 and N-type transistors 520 may be added to a current mirror circuit of the bias generator. An operation of a circuit changed by adding the P-type transistors 510 and the N-type transistors 520 is described based on transistors $M_5$ and $M_{5b}$.

When a plurality of transistors (e.g., the transistors $M_5$ and $M_{5b}$) are used, a resistance value of the transistors may increase, and accordingly currents (e.g., a second current $I_2$) may be more stably generated by the transistors, in comparison to when a single transistor (e.g., the transistor $M_5$) is used in a manner similar to the example of FIG. 4. An influence of a voltage between a drain node of the transistor $M_5$ and a source node of the transistor $M_{5b}$ on generation of the second current $I_2$ may be reduced, and thus the second current $I_2$ may be more stably generated in comparison to the example of FIG. 4.

Similarly, an influence of a voltage between a drain node of a transistor $M_2$ and a source node of the transistor $M_{2b}$ on generation of a first current $I_1$ may be reduced, and thus the first current $I_1$ may be more stably generated in comparison to the example of FIG. 4. The transistor $M_{2b}$ may be included in the P-type transistors 510.

FIG. 6 illustrates an exemplary bias generator that uses a generated reference current $I_{REF}$ through a reference variable resistor $R_{COARSE}$ 610.

The reference current $I_{REF}$ may be generated based on the reference variable resistor $R_{COARSE}$ 610 and a second reference voltage $V_{REF2}$ applied to the reference variable resistor $R_{COARSE}$ 610. Thus, a magnitude of the reference current $I_{REF}$ may be controlled by changing a resistance value of the reference variable resistor $R_{COARSE}$ 610.

By controlling the reference current $I_{REF}$, a range of the bias voltage $V_{bias}$ may be widened or narrowed. Thus, the range of the bias voltage $V_{bias}$ may be controlled by changing the resistance value of the reference variable resistor $R_{COARSE}$ 610.

FIG. 7 illustrates an exemplary bias generator that uses a first reference voltage $V_{REF1}$ generated in a digital-to-analog converter (DAC) 710.

The DAC 710 may convert a digital value to an analog value. For example, the DAC 710 may output the first reference voltage $V_{REF1}$ corresponding to an input digital code. In the example of FIG. 4, the first reference voltage $V_{REF1}$ may have a fixed value, whereas in the example of FIG. 7, the first reference voltage $V_{REF1}$ may be variously changed using the DAC 710. The first reference voltage $V_{REF1}$ may be adjusted using the DAC 710, and thus a bias voltage $V_{bias}$ may be more precisely controlled in a wider range.

The above description of FIG. 4 is also applicable to general operations of the bias generators of FIGS. 5 through 7, and accordingly is not repeated here.

Figure 8:
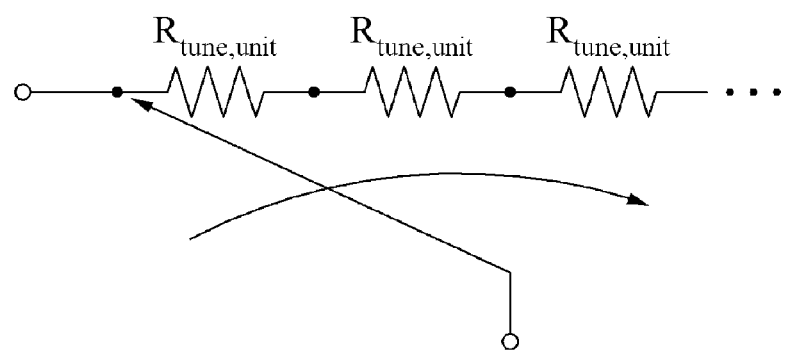
FIG. 8 is a diagram illustrating a variable resistor included in a bias generator according to an exemplary embodiment.

FIG. 8 is a diagram illustrating an exemplary variable resistor $R_{TUNE}$ 800 included in a bias generator according to an exemplary embodiment.

Specifically, FIG. 8 illustrates an example of an internal structure of the variable resistor $R_{TUNE}$ of FIG. 4.

The variable resistor $R_{TUNE}$ 800 may include a plurality of sub-resistors corresponding to basic resistance units $R_{TUNE,unit}$. Also, a number of the sub-resistors included in the variable resistor $R_{TUNE}$ 800 may be determined by a switch. In an example, when a digital code is "000001," the variable resistor $R_{TUNE}$ 800 may include a single sub-resistor and may have a resistance value corresponding to the sub-resistor. In another example, when a digital code is "000010," the variable resistor $R_{TUNE}$ 800 may include two sub-resistors and may have a resistance value corresponding to the two sub-resistors. In still another example, when a digital code is "000000," the variable resistor $R_{TUNE}$ 800 may not include a sub-resistor, and may have a resistance value of 0Ω.

Figure 9:
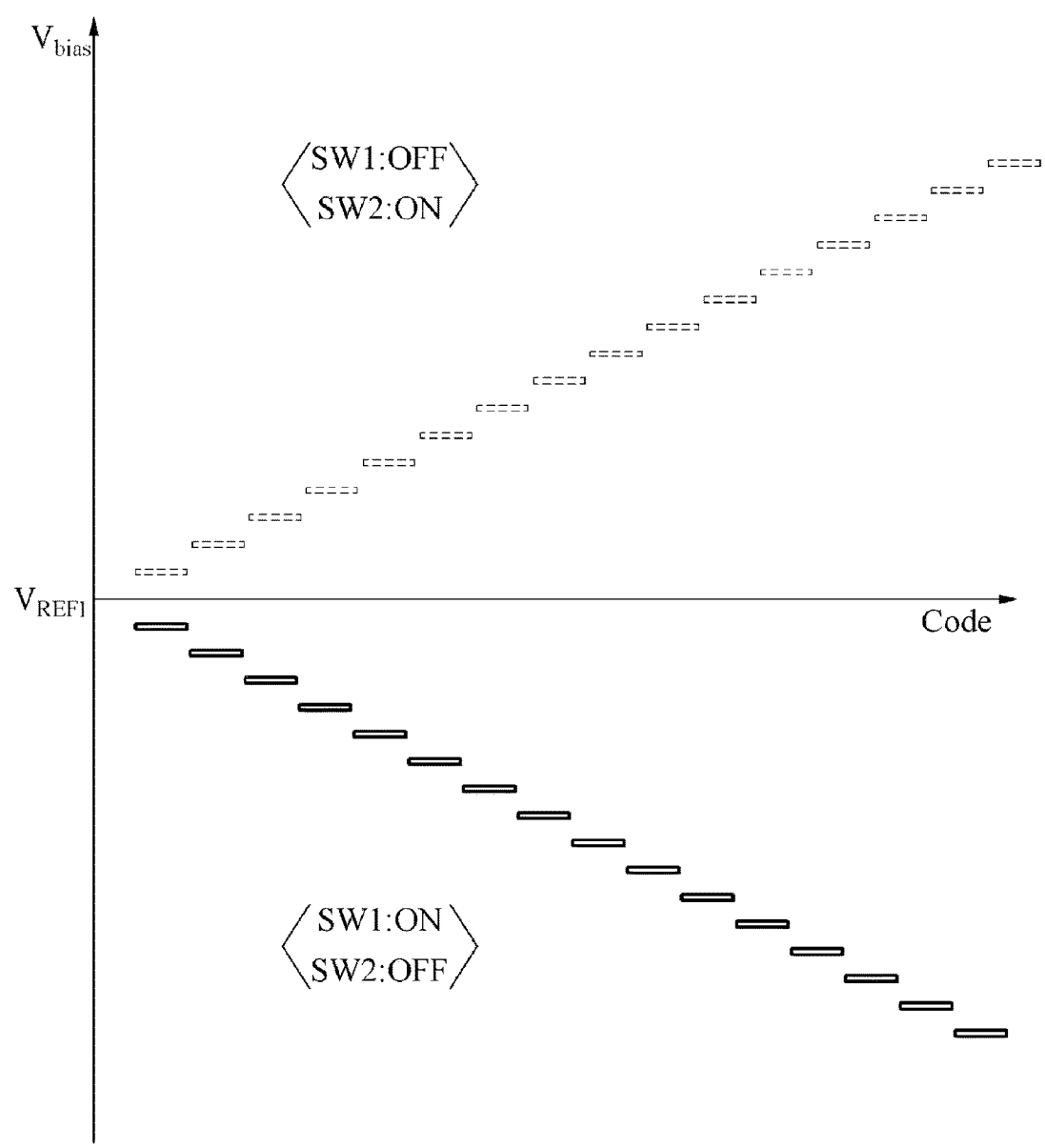
FIG. 9 is a diagram illustrating an exemplary bias voltage generated in a bias generator according to an exemplary embodiment.

FIG. 9 is a diagram illustrating an exemplary bias voltage generated in a bias generator according to an exemplary embodiment.

FIG. 9 illustrates a bias voltage $V_{bias}$ based on a digital code to determine a resistance value of a variable resistor.

In a graph of FIG. 9, an x-axis represents the value of the digital code corresponding to the resistance value of the variable resistor, and a y-axis represents the bias voltage $V_{bias}$. Also, a dashed line box represents a bias voltage $V_{bias}$ generated when a first switch $SW_1$ is turned off and a second switch $SW_2$ is turned on in a switch circuit, and a solid line box represents a bias voltage $V_{bias}$ generated when the first switch $SW_1$ is turned on and the second switch $SW_2$ is turned off.

In the graph of FIG. 9, a constant length of the dashed line box representing the bias voltage $V_{bias}$ may indicate that the bias voltage $V_{bias}$ remains unchanged in a digital code that remains constant.

As shown in the graph of FIG. 9, the bias voltage $V_{bias}$ may have a linear characteristic for the resistance value of the variable resistor with respect to a first reference voltage $V_{REF1}$.

According to exemplary embodiments, it is possible to effectively generate a high bias voltage as well as a low bias voltage using a switch circuit and a current mirror circuit to control a direction in which a current flows in a variable resistor.

Also, according to exemplary embodiments, it is possible to simplify a circuit for generating a high bias voltage and to minimize a power consumption by transferring one of a first current and a second current generated in a current mirror circuit to a variable resistor using a switch circuit.

Furthermore, according to exemplary embodiments, it is possible to enhance a linearity of a bias voltage and stably operate a circuit by adjusting a resistance value stable against PVT variations instead of adjusting a magnitude of a voltage or current to control the bias voltage.

The exemplary embodiments described herein may be implemented using hardware components, software components, or a combination thereof. A processing device may be implemented using one or more general-purpose or special purpose computers, such as, for example, a processor, a controller, an arithmetic logic unit, a digital signal processor, a microcomputer, a field programmable array, a programmable logic unit, a microprocessor, or any other device capable of responding to and executing instructions in a defined manner. The processing device may run an operating system (OS) and one or more software applications that run on the OS. The processing device also may access, store, manipulate, process, and create data in response to execution of the software. For purpose of simplicity, the description of a processing device is used as singular; however, one skilled in the art will appreciated that a processing device may include multiple processing elements and multiple types of processing elements. For example, a processing device may include multiple processors or a processor and a controller. In addition, different processing configurations are possible, such a parallel processors.

The software may include a computer program, a piece of code, an instruction, or some combination thereof, to independently or collectively instruct or configure the processing device to operate as desired. Software and data may be embodied permanently or temporarily in any type of machine, component, physical or virtual equipment, computer storage medium or device, or in a propagated signal wave capable of providing instructions or data to or being interpreted by the processing device. The software also may be distributed over network coupled computer systems so that the software is stored and executed in a distributed fashion. The software and data may be stored by one or more non-transitory computer readable recording mediums.

The method according to the above-described exemplary embodiments may be recorded in non-transitory computer-readable media including program instructions to implement various operations which may be performed by a computer. The media may also include, alone or in combination with the program instructions, data files, data structures, and the like. The program instructions recorded on the media may be those specially designed and constructed for the purposes of the exemplary embodiments, or they may be of the well-known kind and available to those having skill in the computer software arts. Examples of non-transitory computer-readable media include magnetic media such as hard disks, floppy disks, and magnetic tape; optical media such as compact disc read-only memory (CD-ROM) discs and digital versatile discs (DVDs); magneto-optical media such as optical discs; and hardware devices that are specially configured to store and perform program instructions, such as read-only memory (ROM), random access memory (RAM), flash memory, and the like. Examples of program instructions include both machine code, such as code produced by a compiler, and files containing higher level code that may be executed by the computer using an interpreter. The described hardware devices may be configured to act as one or more software modules in order to perform the operations of the above-described exemplary embodiments, or vice versa.

While this disclosure includes exemplary embodiments, it will be apparent to one of ordinary skill in the art that various changes in form and details may be made in these exemplary embodiments without departing from the spirit and scope of the claims and their equivalents. The exemplary embodiments described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

While the present disclosure has been described with reference to exemplary embodiments, it will be apparent to those skilled in the art that various changes and modifications may be made without departing from the spirit and scope of the present disclosure. Therefore, it should be understood that the above embodiments are not limiting, but illustrative.

What is claimed is:

1. A bias generator comprising:
   a current mirror circuit configured to generate a first current and a second current based on a reference current;
   a switch circuit configured to transfer one of the first current and the second current to a variable resistor; and
   an operational amplifier comprising a first input connected to an output of the switch circuit, a second input that receives a reference voltage, and an output that outputs a bias voltage,
   wherein the variable resistor is connected between the first input and the output of the operational amplifier, and
   wherein, by switching operation of the switch circuit, a first direction in which the first current flows in the variable resistor is different from a second direction in which the second current flows in the variable resistor.

2. The bias generator of claim 1, wherein the bias voltage is determined based on (i) the reference voltage, and (ii) one of a voltage drop and a voltage rise that occurs in the variable resistor.

3. The bias generator of claim 1, wherein the bias voltage is determined based on the reference voltage, the variable resistor, and one of the first current and the second current flowing in the variable resistor.

4. The bias generator of claim 1, wherein the bias voltage has a linear characteristic for a resistance value of the variable resistor with respect to the reference voltage.

5. The bias generator of claim 1, wherein the current mirror circuit comprises a first current mirror comprising a first transistor and a second transistor,
   wherein a gate of the first transistor and a gate of the second transistor are connected to each other,
   wherein the reference current flows through the first transistor, and
   wherein the first current is generated in the second transistor and is transferred to the switch circuit.

6. The bias generator of claim 5, wherein the current mirror circuit further comprises a second current mirror comprising the first transistor, a third transistor, a fourth transistor, and a fifth transistor,
   wherein the gate of the first transistor and a gate of the third transistor are connected to each other, and a gate of the fourth transistor and a gate of the fifth transistor are connected to each other,
   wherein the reference current flows through the first transistor,
   wherein a third current is output from the third transistor based on the reference current and flows through the fourth transistor, and
   wherein the second current is generated in the fifth transistor and is transferred to the switch circuit.

7. The bias generator of claim 6, wherein the current mirror circuit further comprises a third current mirror comprising the first transistor, a sixth transistor, and a seventh transistor,
   wherein the gate of the first transistor and a gate of the sixth transistor are connected to each other,
   wherein the reference current flows through the first transistor,
   wherein a fourth current is output from the sixth transistor based on the reference current and flows through the seventh transistor, and
   wherein the reference voltage is output from a gate of the seventh transistor and is applied to the second input of the operational amplifier.

8. The bias generator of claim 1, wherein the switch circuit comprises:
   a first switch configured to connect the current mirror circuit and the variable resistor to transfer the first current generated in the current mirror circuit to the variable resistor; and
   a second switch configured to connect the current mirror circuit and the variable resistor to transfer the second current generated in the current mirror circuit to the variable resistor.

9. The bias generator of claim 1, further comprising a reference current generator configured to generate the reference current and transfer the reference current to the current mirror circuit,
   wherein the reference current generator comprises:
      a reference operational amplifier comprising a third input to which a second reference voltage is applied, a fourth input connected to a reference resistor, and a second output connected to a gate of a reference transistor;
      the reference resistor in which the reference current generated based on the second reference voltage flows; and
      the reference transistor in which the reference current flows, the reference transistor being connected between the reference resistor and the current mirror circuit.

10. The bias generator of claim 1, wherein the reference current is generated in response to a second reference voltage being applied to a reference variable resistor, and is transferred to the current mirror circuit.

11. The bias generator of claim 1, wherein the reference voltage is output from a digital-to-analog converter (DAC) based on a digital code input to the DAC, and is applied to the second input node of the operational amplifier.

12. A method comprising:
   generating, via a current mirror circuit, a first current and a second current based on a reference current;
   transferring, via a switch circuit, one of the first current and the second current to a variable resistor that is connected between a first input of an operational amplifier and an output of the operational amplifier; and
   outputting, via the output of the operational amplifier, a bias voltage determined based on (i) the one of the first current and the second current flowing in the variable resistor, and (ii) a reference voltage provided to a second input of the operational amplifier,
   wherein, by switching operation of the switch circuit, a first direction in which the first current flows in the variable resistor is different from a second direction in which the second current flows in the variable resistor.

13. The method of claim 12, wherein the current mirror circuit comprises a first current mirror comprising a first transistor and a second transistor,
   wherein a first gate of the first transistor and a second gate of the second transistor are connected to each other,
   wherein the reference current flows through the first transistor, and
   wherein the first current is generated in the second transistor and is transferred to the switch circuit.

14. The method of claim 13, wherein the current mirror circuit further comprises a second current mirror comprising the first transistor, a third transistor, a fourth transistor, and a fifth transistor,
   wherein the first gate of the first transistor and a third gate of the third transistor are connected to each other, and a fourth gate of the fourth transistor and a fifth gate of the fifth transistor are connected to each other,
   wherein a third current is output from the third transistor based on the reference current and flows through the fourth transistor, and
   wherein the second current is generated in the fifth transistor and is transferred to the switch circuit.

15. The method of claim 14, wherein the current mirror circuit further comprises a third current mirror comprising the first transistor, a sixth transistor, and a seventh transistor,
   wherein the first gate of the first transistor and a sixth gate of the sixth transistor are connected to each other,
   wherein a fourth current is output from the sixth transistor based on the reference current and flows through the seventh transistor, and
   wherein the reference voltage is output from a gate of the seventh transistor and is applied to the second input of the operational amplifier.

16. The method of claim 12, wherein the switch circuit comprises:
   a first switch configured to connect the current mirror circuit and the variable resistor to transfer the first current generated in the current mirror circuit to the variable resistor; and
   a second switch configured to connect the current mirror circuit and the variable resistor to transfer the second current generated in the current mirror circuit to the variable resistor.

* * * * *